United States Patent [19]
Callaway, Jr. et al.

[11] Patent Number: 5,678,223
[45] Date of Patent: Oct. 14, 1997

[54] METHOD AND APPARATUS FOR AN AUTOMATIC FREQUENCY CONTROL RECEIVER

[75] Inventors: Edgar Herbert Callaway, Jr., Boca Raton; Frederick Loring Kampe, Boynton Beach; Gary Lee Pace, Boca Raton; James David Hughes, Boynton Beach, all of Fla.

[73] Assignee: Motorola, Inc., Schaumburg, Ill.

[21] Appl. No.: 399,785

[22] Filed: Mar. 7, 1995

[51] Int. Cl.$^6$ ........................................... H04B 1/26
[52] U.S. Cl. .................. 455/324; 455/182.1; 455/182.2; 455/192.2; 455/196.1
[58] Field of Search ........................ 455/182.1, 182.2, 455/192.2, 192.1, 44, 208, 209, 196.1, 255–259, 264–265, 324, 304; 375/344

[56] References Cited

U.S. PATENT DOCUMENTS

| | | |
|---|---|---|
| 4,403,345 | 9/1983 | Granek et al. .................. 455/183.2 |
| 4,405,897 | 9/1983 | Taylor et al. . |
| 4,885,802 | 12/1989 | Ragan . |
| 5,341,402 | 8/1994 | Matsushita et al. .................. 455/182.2 |

*Primary Examiner*—Chi H. Pham
*Assistant Examiner*—Gertrude Arthur
*Attorney, Agent, or Firm*—Aaron B. Bernstein; D. Andrew Floam

[57] ABSTRACT

A receiver circuit (10), and method for automatic frequency control of a receiver circuit (10) suitable for receiving a radio frequency (RF) signal, featuring determination of at least one parameter other than a frequency error of a signal which is mixed with the RF signal received by the receiver circuit; and adjusting the frequency of the signal which is mixed with the RF signal based on the frequency error if the at least one parameter satisfies a predetermined criterion.

33 Claims, 8 Drawing Sheets

5,678,223

1

METHOD AND APPARATUS FOR AN AUTOMATIC FREQUENCY CONTROL RECEIVER

RELATED APPLICATION

Zero-IF Receiver with Tracking Second Local Oscillator and Demodulator Phase Locked Loop Oscillator, to Pace et al. application Ser. No. 08/399,805 which is now a U.S. Pat. No. 5,606,731.

FIELD OF THE INVENTION

This invention relates in general to the field of radio frequency communication receivers, and more particularly to a method and apparatus for performing automatic frequency control in a frequency modulation (FM) receiver.

BACKGROUND OF THE INVENTION

Automatic Frequency Control (AFC) techniques are useful in a receiver circuit to remain precisely tuned to a transmitted signal. However, AFC is not lacking in certain challenges. Prior art AFC receiver circuits do not perform well in weak signal conditions, such as in the presence of interference, and also in asynchronous environments where the signal to track may, or may not, be present at a given time.

An AFC receiver circuit may also compensate for variations in the oscillator frequency due to aging, shock, temperature, etc.

It is desirable to provide a receiver circuit with highly accurate frequency tracking by employing specialized AFC techniques.

DETAILED DESCRIPTION OF THE DRAWINGS

Figure 1:
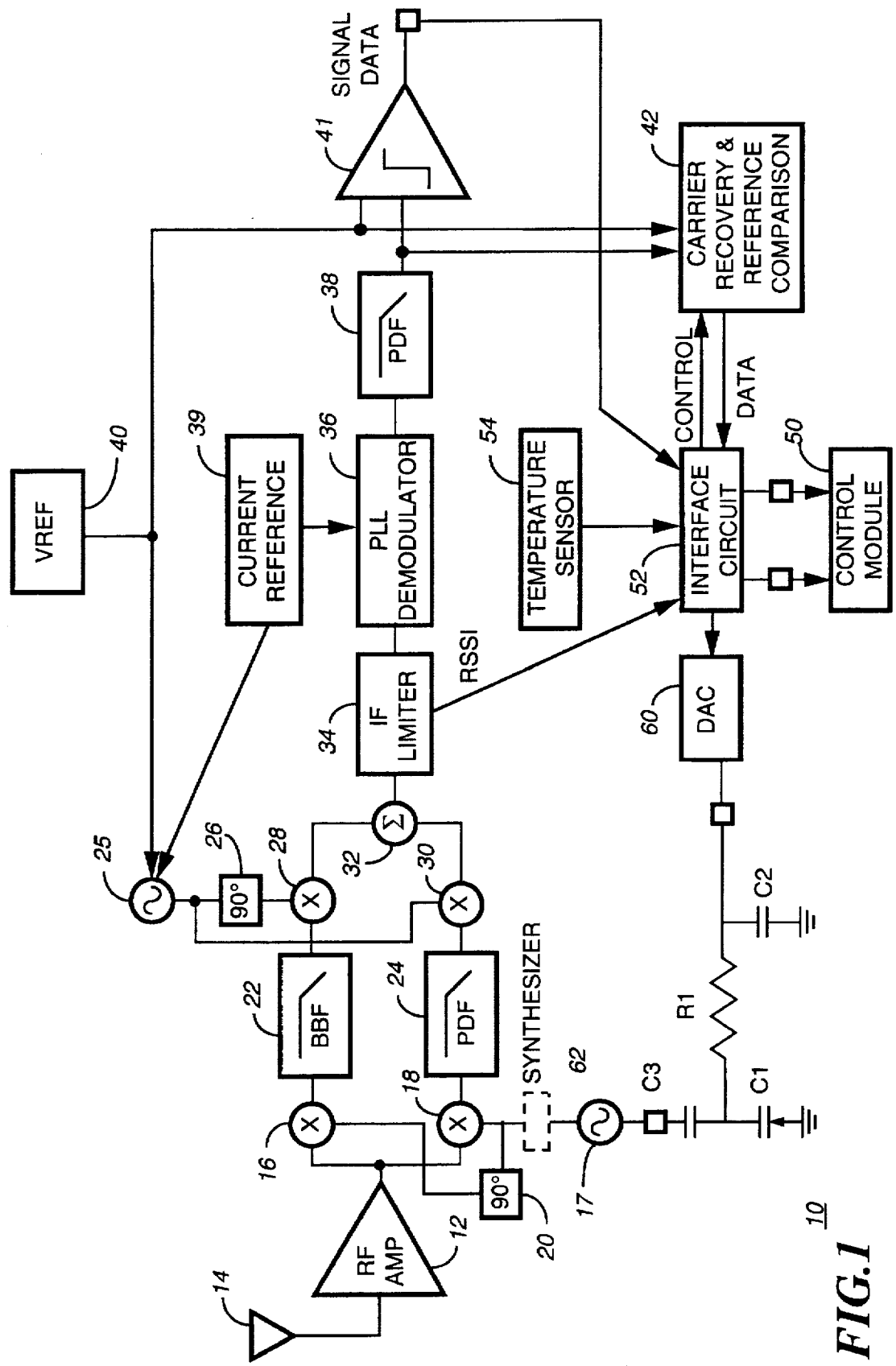
FIG. 1 is an electrical block diagram of a receiver circuit according to the present invention.

Referring to FIG. 1, a receiver circuit having AFC feedback is shown generally at 10. The various AFC processes shown in FIGS. 3–6 to be described hereinafter are applicable to any receiver circuit having AFC feedback. An example of a receiver circuit to which the AFC processes apply is one which includes at a minimum a mixer section for mixing the received radio frequency (RF) signal with a mixing signal which has a frequency which is adjustable for controlling how the received signal is mixed to a frequency which is more ideal for further processing.

In brief, the present invention involves determining at least one parameter other than a frequency error of a signal mixed with the received RF signal, and adjusting the frequency of the signal which is mixed with the RF signal based on the frequency error if the at least one parameter satisfies a predetermined criterion.

FIG. 1 illustrates a zero-IF receiver circuit 10 according to the present invention. The zero-IF receiver circuit 10 is referred to hereinafter as ZIF (standing for "Zero-IF") receiver circuit 10, for simplicity, and is a Barber type receiver circuit. The ZIF receiver circuit 10 (not necessarily including the control module 50 described hereinafter) is preferably fabricated as a single integrated circuit (IC).

The ZIF receiver circuit 10 comprises a radio frequency (RF) amplifier 12 for amplifying a signal detected by an antenna 14. A first local oscillator 17 is provided to generate a first local oscillator signal for a pair of mixers 16 and 18, and a 90° phase shifter 20.

Specifically, mixer 16 mixes the amplified RF signal with the 90° phase shifted version of the first local oscillator signal, to ultimately recover an in-phase (I) component of the received signal. Mixer 18 mixes the amplified RF signal with the first local oscillator signal to ultimately recover a quadrature (Q) component of the received signal. The frequency of the first local oscillator signal is, for example, 150 MHz, in the case of a VHF selective call receiver. The outputs of the mixers 16 and 18 are coupled to base band filters (BBF's) 22 and 24, respectively.

A second pair of mixers is provided which is driven by a second local oscillator 25 and comprises a 90° phase shifter 26 and mixers 28 and 30, for the I and Q components respectively. The outputs of the BBF's 22 and 24 are connected to the inputs of the mixers 28 and 30, respectively. In the second mixing stage, the I and Q base band components are mixed up in frequency by mixers 28 and 30, and added by summing circuit 32 to generate an intermediate frequency signal for demodulation. In the example of a selective call receiver, a typical frequency of the second local oscillator circuit 25 is 50 kHz.

An IF limiter 34 is connected to the output of the summing circuit 32 to amplify the intermediate frequency signal and generate a limited output.

The IF limiter 34 also optionally provides received signal strength indication (RSSI), which has special utility in the present invention, as will be explained hereinafter. However, this RSSI can also be derived from elsewhere within the receiver.

A phase locked loop demodulator 36 is connected to the output of the IF limiter 34 and demodulates the output signal of the IF limiter 34 to recover the frequency modulated signal, which is ultimately filtered by the post detection filter (PDF) 38. The output of the phase locked loop demodulator 36 is the unfiltered recovered audio signal. The output of the PDF 38 is the recovered audio signal, represented as Vin.

A voltage reference (Vref) 40 provides a voltage reference signal for the second local oscillator 25, the data limiter 41 and the carrier recovery and reference comparison circuit 42.

A current reference circuit 39 provides a current reference signal to the second local oscillator 25 and the phase locked loop demodulator 36.

The output of the PDF 38 is coupled to a data limiter 41 and to a carrier recovery and reference comparison circuit 42. The data limiter 41 compares the recovered audio signal Vin with reference voltage (Vref) 40 and generates as output SIGNAL DATA, which corresponds to the binary data that was transmitted.

The SIGNAL DATA is also coupled to the control module and monitored by the control module 50, as explained below, to determine whether the baud rate of the modulated RF signal, as represented by the SIGNAL DATA, is substantially equal to a predetermined baud rate, which process is hereinafter referred to as baud detection.

The carrier recovery and comparison circuit 42 is also coupled to the output of the PDF 38 and uses Vref 40 to determine the PEAK and VALLEY levels of the recovered modulation. The PEAK and VALLEY levels are then used to determine the frequency error (explained in more detail hereinafter), ultimately to adjust the frequency of the first local oscillator 17. The frequency error computation is performed in the carrier recovery and reference comparison circuit 42, or optionally in the control module 50, to be explained below.

Generally, the frequency error FE is represented by the expression $FE = f_c +/- f_m -/+ f_{if}$, where $f_c$ is the carrier frequency of the received RF signal, $f_m$ is the frequency of a signal to be mixed with the RF signal (the first local oscillator signal of first local oscillator 17 or the signal generated by synthesizer 62) and $f_{if}$ is the frequency of an intermediate frequency signal. The signal to be mixed with the received RF signal, called a mixing signal hereinafter, also is often referred to as a mixer injection signal having a frequency called an injection frequency. In a ZIF receiver circuit, the intermediate frequency is zero. The frequency error has a magnitude and direction, the direction being positive or negative, indicating whether the frequency of the signal which is mixed with the received RF signal is greater than the frequency of the received RF signal, or whether the opposite is the case. It is envisioned that in some applications, only the direction (positive or negative) of the frequency error is determined. In this case, the frequency of the signal which is mixed with the received RF signal is adjusted in the proper direction by a fixed or predetermined amount.

The output of the carrier recovery and reference comparison circuit 42 is denoted CARRIER RECOVERY DATA and includes the PEAK and VALLEY levels and/or the frequency deviation information and/or the frequency error information.

An important and distinctive aspect of the ZIF receiver circuit 10 is that the second local oscillator 25 and the oscillator (not shown in FIG. 1) in the phase locked loop demodulator 36 are identical and track each other, and are controlled by the same current reference circuit 39. This configuration allows VREF 40 to be used as a channel center frequency reference, limited only by tracking accuracy. Therefore, the voltage reference (VREF) 40 can be used as the threshold voltage for the data limiter 41 and the reference voltage for the carrier recovery and reference comparison circuit 42. The aforementioned co-pending application is directed to the foregoing aspects.

A control module 50 is provided which receives as input through an interface circuit 52, the outputs of the data limiter 41, the carrier recovery and reference comparison circuit 42, an optional temperature sensor 54 and optional RSSI. The temperature sensor 54 monitors the temperature of the integrated circuit on which the ZIF receiver circuit 10 is implemented. The control module 50 issues control commands back to certain circuits through the interface circuit 52.

If digital control for the module 50 is used, a digital-to-analog converter (DAC) 60 is provided and connected to the output of the interface circuit 52.

The control module 50 contains an AFC routine for controlling the input to DAC 60 via interface circuit 52 based upon the inputs received from the data limiter 41 and carrier recovery and reference comparison circuit 42. The carrier recovery and reference comparison circuit 42 and/or control module 50 also introduces a small time delay which tends to keep the AFC loop stable.

The control module 50 is, for example, a microprocessor controller, such as a Motorola MC68HC05. In this case, the interface circuit 52 is compatible with a serial peripheral interface (SPI) used in conjunction with the microprocessor controller. Other type of controllers are also useful including other digital or analog controllers. The control module 50 is also useful to perform other computational functions, such as computing the frequency error and frequency deviation based on the PEAK and VALLEY levels, as mentioned above.

To complete the AFC loop, a varactor-tuned or voltage variable capacitor (VVC) C1 is DC (direct current) coupled, via capacitor C2 and resistor R1, to the output of the DAC 60. The capacitor C1 is alternating current (AC) coupled via capacitor C3 to the first local oscillator 17.

As an alternative, the ZIF receiver circuit 10 is frequency synthesized by a synthesizer 62 which is coupled between the first local oscillator 17, mixer 18 and phase shifter 20. The frequency synthesizer 62 converts the frequency of the signal generated by the first local oscillator 17, called the mixing signal, to one of a plurality of frequencies.

Figure 2:
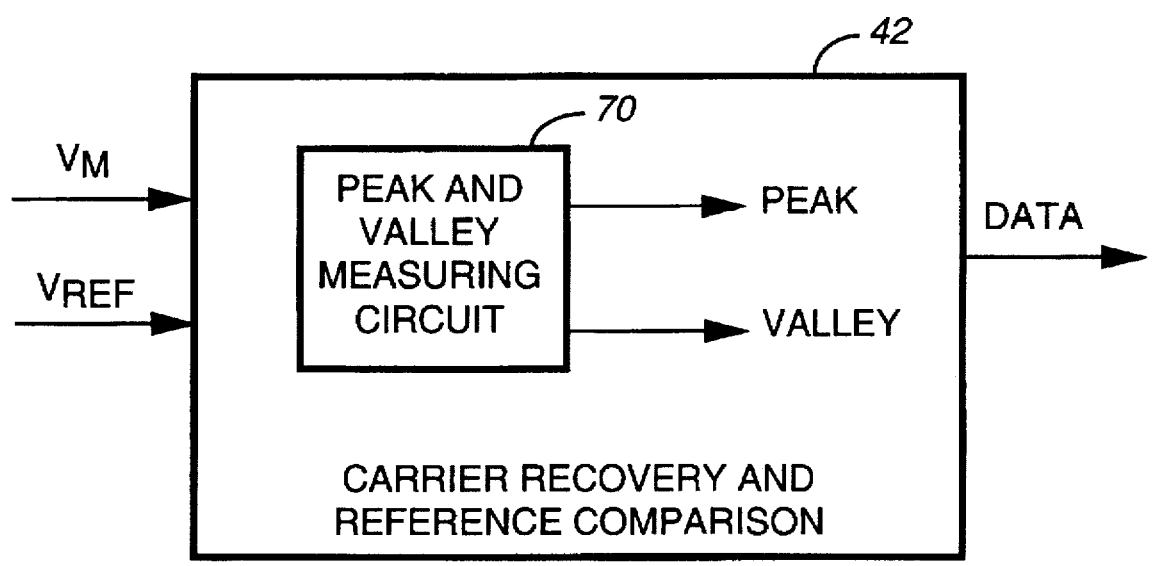
FIG. 2 is an electrical block diagram of a carrier recovery and comparison circuit including a peak and valley measuring circuit.

FIG. 2 illustrates the carrier recovery and reference comparison circuit 42 in greater detail, and which includes a peak and valley measuring circuit 70. A peak and valley measuring circuit 70 is well known in the art, and determines values representative of the relative minimum and maximum peaks in the output of the post detection filter 38.

In order to perform automatic frequency control of the ZIF receiver circuit 10, the carrier of the received signal is recovered and compared, very accurately and with minimal offset, to the voltage reference signal provided by Vref. The output of the peak and valley measuring circuit 70 are digital counter values PEAK and VALLEY, which are representative of the relative maximum (peak) and relative minimum (valley) of the recovered audio signal relative to Vref, and are used to recover the carrier. These values are made available to the control module 50 via the interface circuit 52.

Thus, the control module 50 also has the following information made available to it concerning the received signal:

1. Received data in the received signal (at the output of the data limiter 41), from which a baud detection estimation is made.
2. PEAK and VALLEY values of the received signal, relative to the frequency channel center reference, Vref, from which frequency deviation and frequency error are computed.
3. Optionally, RSSI level information.
4. Optionally, ambient temperature information.

Examples of techniques for baud detection are disclosed in commonly assigned U.S. Pat. No. 5,095,498 to DeLuca et al.

Figure 8:
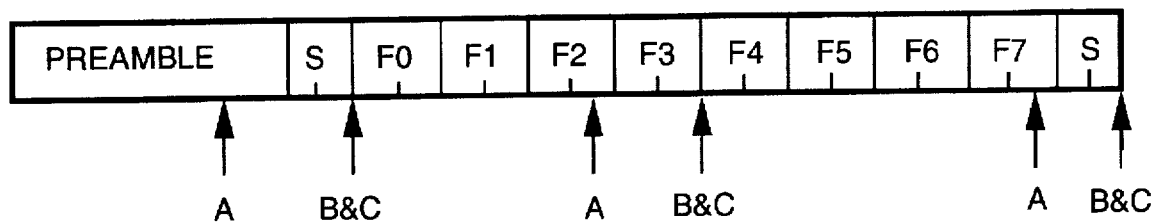
FIG. 8 is a timing diagram of a POCSAG paging protocol signal.

The baud detection measurement, PEAK and VALLEY values, RSSI level information and ambient measurement information are taken at time intervals or cycles which are not necessarily periodic. For example, in receiving a POCSAG signal when the receiver is asynchronous (as shown in FIG. 8), these measurements are taken approximately once per second; when the receiver is synchronous, these measurements are taken approximately three times per second.

Furthermore, certain measurements made each cycle are averaged with measurements taken at a prior cycle, such as frequency error, for example, as will be explained further hereinafter. In this manner, an average for frequency error, for example, is maintained.

In accordance with the present invention, the control module 50 makes decisions concerning the reception of the received signal, the frequency offset of the receiver circuit from the carrier of the received signal, and whether or not a frequency correction of the first local oscillator 17 should be made. Depending on the information made available to the control module 50, the control module 50 makes a correction of, for example, the frequency of the first local oscillator signal generated by the first local oscillator 17. If a change in the frequency is to be made, the control module sends a command via the interface circuit 52 to change the voltage on the varactor or VVC C1.

The decision process implemented by the control module 50 is, for example, embodied by software executed by a microprocessor controller.

Figure 3:
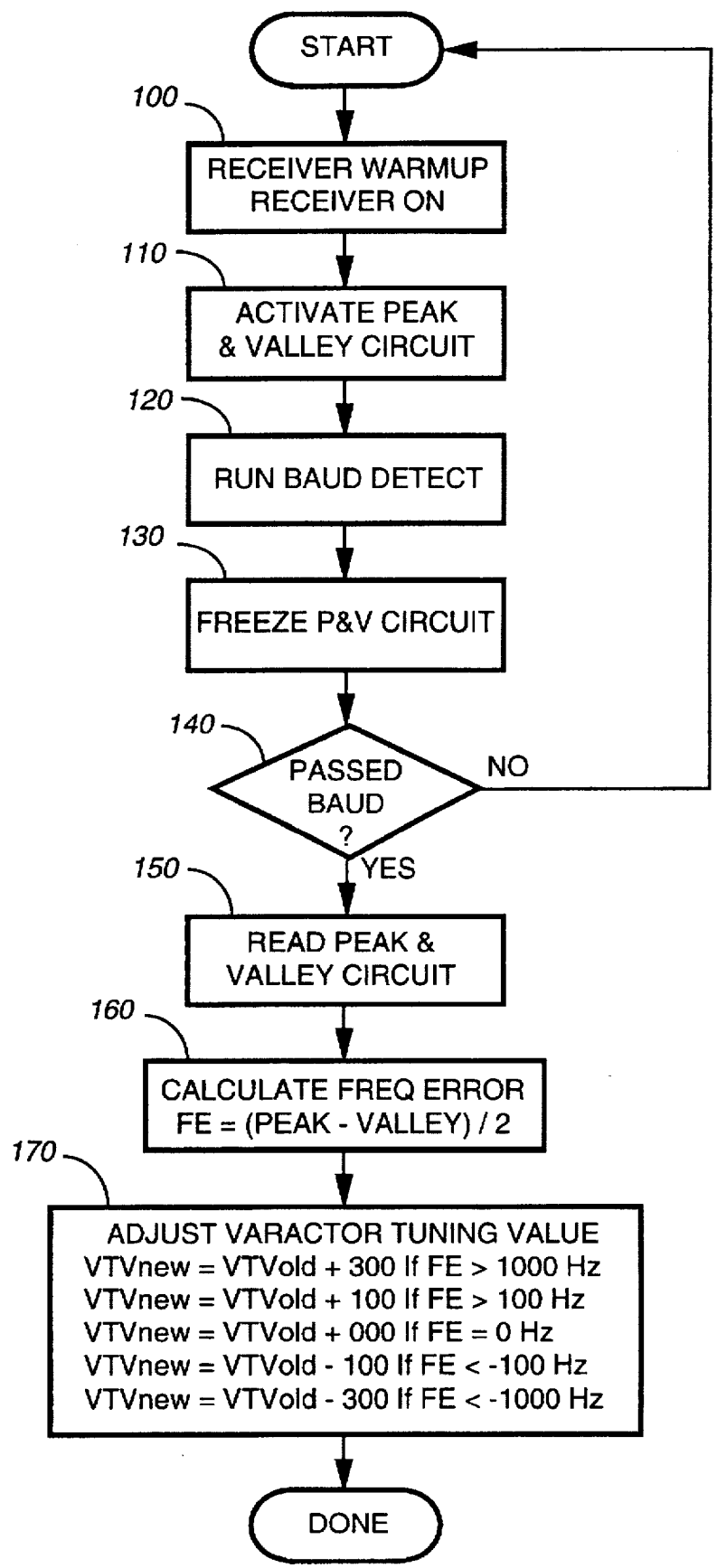
FIG. 3 is a flow chart diagram illustrating a method for automatic frequency control according to a first embodiment of the present invention.

FIG. 3 illustrates a first AFC decision process in connection with, as an example, a paging channel. In step 100, the receiver is turned ON and is warmed-up. After receiver warm-up, in step 110, the peak and valley measuring circuit 70 is activated. Next, in step 120 the baud detection procedure is executed based on data in the received signal and in step 130 the peak and valley measuring circuit 70 is frozen to maintain the PEAK and VALLEY values at that time. In step 140, a determination is made whether baud detection is passed. Baud detection is passed if the detected signal is within 3% (or some other adjustable value) of the expected baud rate. If baud detection does not pass, then the procedures restarts from the beginning.

Step 140 is preferably a pass or fail measurement, but is optionally based on a "quality" of the baud rate match, wherein a value is assigned based on a confidence of the baud rate match.

Next, in step 150, the PEAK and VALLEY values which were frozen in step 130 are read from the peak and valley measuring circuit 70 if baud detection is passed. Then, in step 160, a frequency error FE is computed based on the difference between the PEAK and VALLEY values. Finally, in step 170 the tuning value of the varactor or VVC C1 is adjusted depending on a magnitude of the frequency error FE as shown in step 170. For example, if the frequency error FE is greater than 1000 Hz, then VTVnew is set to 300 Hz over VTVold.

In FIG. 3, step 170 is optionally altered to provide for a fixed or predetermined adjustment (VTVnew) based on the direction or "sign" of the frequency error FE. For example, when FE>0, then VTVnew=VTVold−FIXED FREQ. ADJUSTMENT FACTOR, such as 300 kHz, for example, and when FE<0, then VTVnew+FIXED FREQ. ADJUSTMENT FACTOR.

Some protocols are asynchronous in that a signal is not always transmitted, in which case noise will be received if a signal is not. With the use of the baud detection qualification or received signal deviation information in accordance with the present invention, these situations are detected and frequency corrections based on signals other than the desired signal are prevented.

Figure 4:
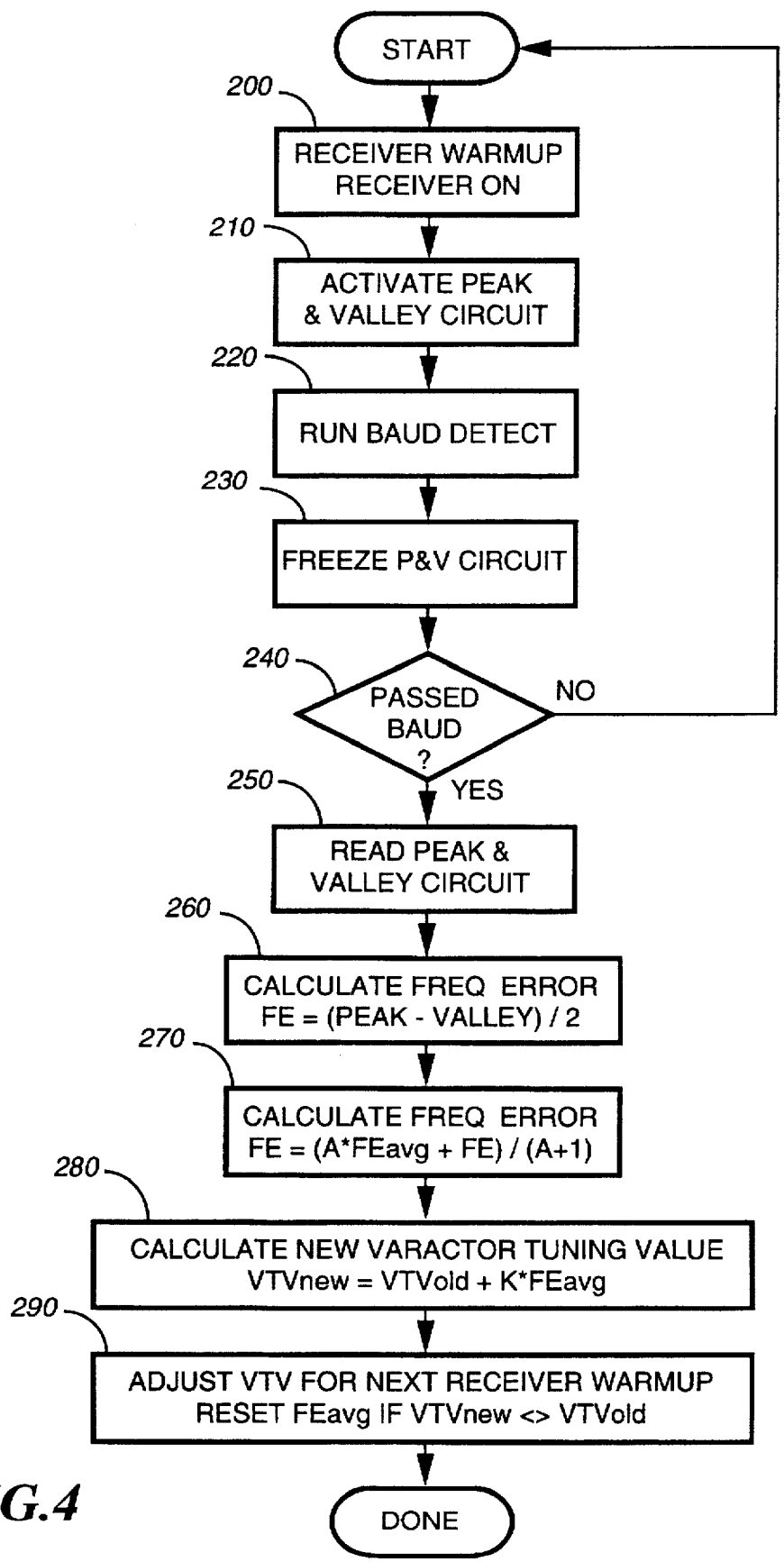
FIG. 4 is a flow chart diagram illustrating a method for automatic frequency control according to a second embodiment of the present invention.

FIG. 4 illustrates a second AFC decision process according to the present invention for a paging channel, and in particular features averaging computations. Steps 200, 210, 220, 230, 240, 250 and 260, are similar to steps 100, 110, 120, 130, 140, 150 and 160 of FIG. 3. In this process, measurements are averaged after the frequency error FE is computed in step 260. In step 270, an updated average frequency error FEavg is computed according to the expression FEavgnew=(A)(FEavgold+FE)/(A+1), where A is a weighting factor that controls the effective window length of the running average, which basically controls how fast the system responds. FEavgold is the average frequency error at the previous cycle. The ratio (A)/(A+1) is a number between 0 and 1 which can be considered a decay rate and is similar to a loop gain value. If the value of A is too large, the system will take longer to respond, and if too small the system will respond faster, and possibly too fast, resulting in adjustments based on erroneous data.

Next, in step 280, a new varactor tuning value is calculated by the expression VTVnew=VTVold+K(FEavgnew) to change the tuning frequency of capacitor C1. The constant K is a proportionality constant which relates the frequency error FE to the varactor tuning value and is approximately equal to the inverse of the step size in Hz of the DAC 60. Finally, in step 290, if the new varactor tuning value VTVnew is different than the old varactor tuning value VTVold, then the average frequency error FEavg is reset, and optionally is written into the EEPROM of a pager.

The procedures of FIGS. 3 and 4 are also optionally modified to replace the baud detection steps 140 and 240 with an RSSI decision step in which the output of the IF limiter is used to proceed to steps 150 and 150, respectively, if the RSSI is, for example, 3dB above threshold sensitivity, which in a paging channel is approximately −130 dBm, for example. Thus, there is sufficient information to recognize a no-signal condition, and not make a frequency-offset correction. However, even if a frequency-offset correction is made, it is conservative; smaller corrections are made as the received signal strength decreases.

Figure 5:
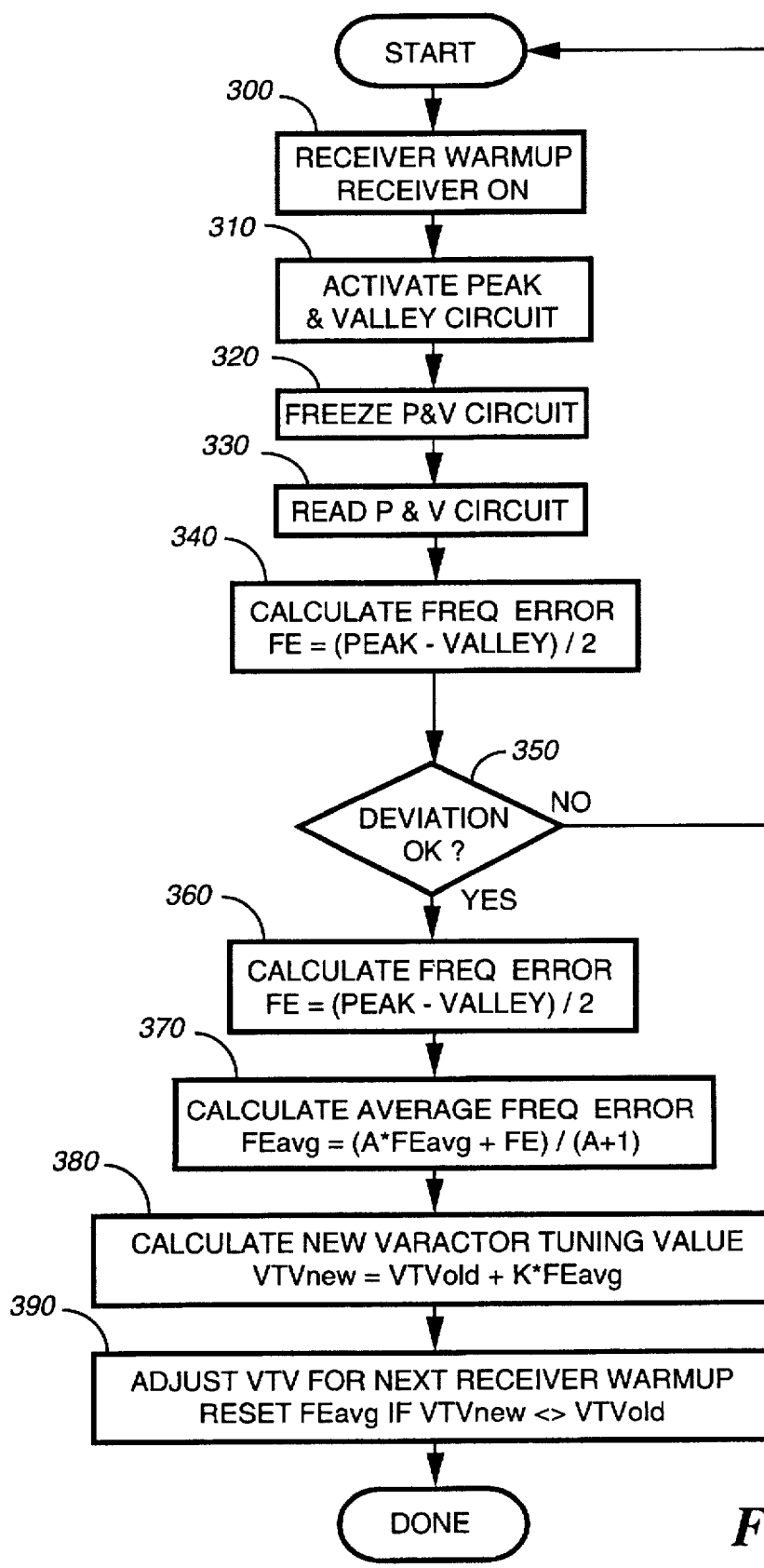
FIG. 5 is a flow chart diagram illustrating a method for automatic frequency control according to a third embodiment of the present invention.

FIG. 5 illustrates a third AFC decision process according to the present invention for a paging channel In FIG. 5, steps 300, 310, and 320 are similar to steps 100, 110 and 120 of FIG. 1. The process shown in FIG. 5 is similar to that of FIG. 4 except that signal deviation DEV is used instead of baud detection as a key factor. In addition, the PEAK and VALLEY values are read in step 330 before the signal deviation DEV is computed. In step 340, a signal deviation DEV is computed for the current values of PEAK and VALLEY and the signal deviation DEV is used to validate the frequency error measurement, in much the same way that the baud detection is used in FIGS. 3 and 4. In step 350, it is determined whether the value of the deviation DEV is satisfactory. A satisfactory received deviation DEV in a paging channel, for example, is between 3 kHz and 8 kHz and if this is the case, then in step 360, the frequency error FE is computed. In step 370, the average frequency error FEavg is computed. Next, in step 380, the new varactor tuning value VTVnew is computed. Finally, in step 390, the appropriate changes of the stored data is made, similar to step 290 of FIG. 4.

FIG. 5 illustrates a procedure which is an enhancement of the procedures of FIGS. 3 and 4 to address the situation where the interference is severe enough that baud detection passes, in which case a frequency correction would be made. However, additional information in the form of positive and negative deviations of the received signal is available, in addition to RSSI. Additional requirements on the received signals deviation are imposed before a frequency correction is made. For example, should baud detection pass and the received deviation is 2 kHz for PEAK and 0 kHz for VALLEY, then the received signal is unlikely to be a POCSAG signal, for example, and is more likely to be an unmodulated carrier 2 kHz away from the channel center. In this case, no correction is made despite a (likely false) baud detection. By the use of the recovered deviation information, the system is made more robust and unlikely to be affected by interference.

The steps shown in FIG. 5 are optionally implemented during baud detection.

Figure 6:
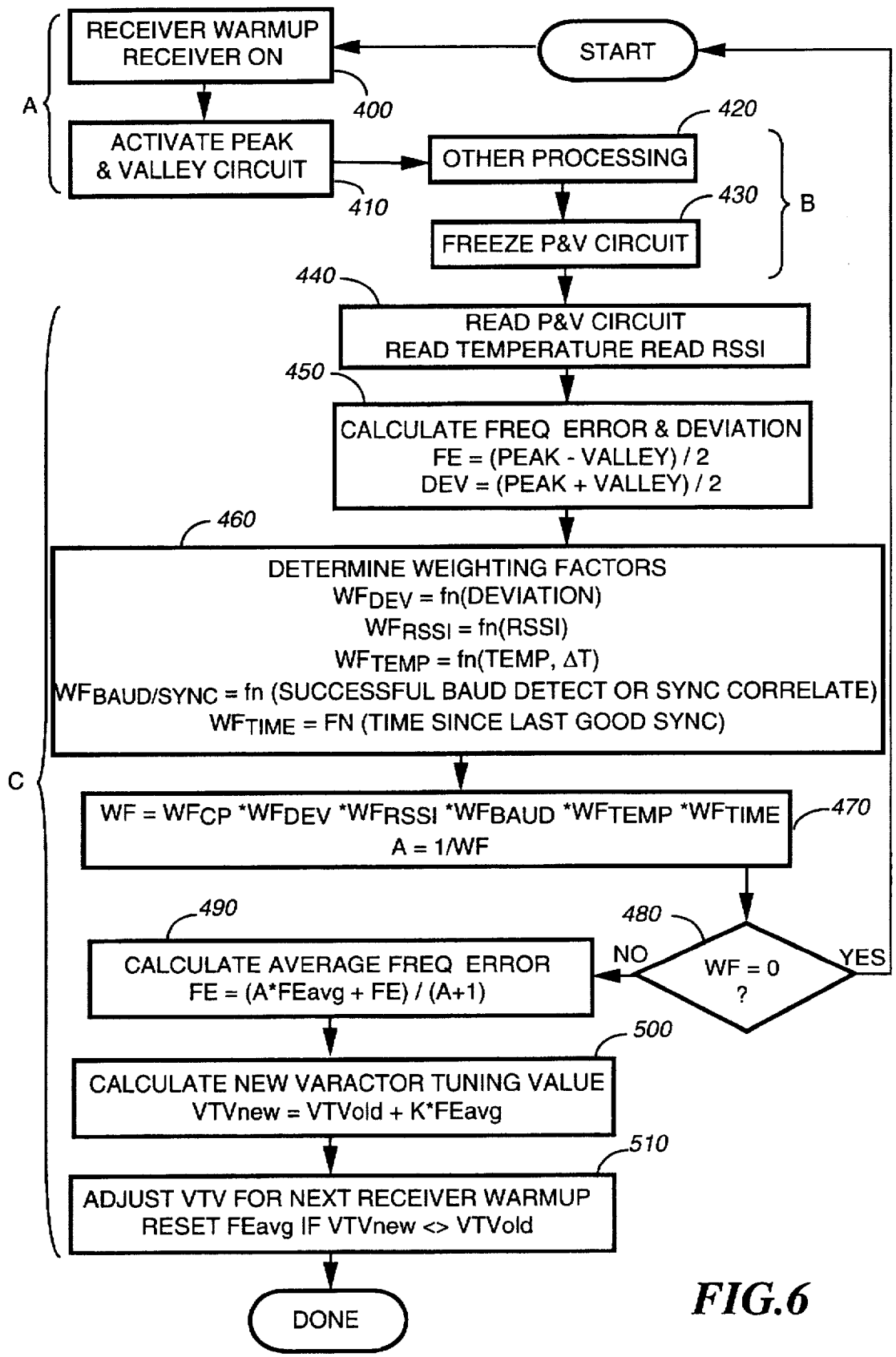
FIG. 6 is a flow chart diagram illustrating a method for automatic frequency control according to a fourth embodiment of the present invention.

FIG. 6 illustrates a fourth AFC decision process according to the present invention for a paging channel which is more robust than the procedures shown in FIGS. 3–5 because the procedure allows for "graceful" failure or a gradual degradation as one or more of the detected parameters goes outside of normal ranges. There are several parameters or factors that are considered in determining how to adjust the frequency of the first local oscillator 17. These factors are $WF_{DEV}$ for signal deviation, $WF_{RSSI}$ for RSSI determination, $WF_{TEMP}$ for ambient temperature variations, $WF_{BAUD/SYNC}$ for baud detection determination and $WF_{TIME}$ for time since last successful sync word correlation. The tables set forth below depict the values of each of these factors.

A composite weighting factor WF is generated based on the product of each of these individual weighting factors in addition to a programmable factor $WF_{CP}$ which is a value that is used to normalize the overall factor to adjust for different response times of different signaling speeds and protocols. For example, $WF_{CP}$(POCSAG512)=16;

$WF_{CP}$(POCSAG1200)=32;

$WF_{CP}$(POCSAG2400)=64; and $WF_{CP}$(FLEXT™)=1.

Signal Deviation $WF_{DEV}$

| DEVIATION (kHz) | WEIGHT |
| --- | --- |
| 0–3 | 0% |
| 3–6 | 100% |
| 6–8 | 50% |
| 8–10 | 25% |
| >10 | 0% |

Received Signal Strength Indication $WF_{RSSI}$

| RSSI | WEIGHT |
| --- | --- |
| <10% | 0% |
| 10–40% | 50% |
| 40–90% | 100% |
| >90% | Partial Weight |

Baud Detection or Sync Correlation $WF_{BAUD/SYNC}$

| PASS/NO PASS | WEIGHT |
| --- | --- |
| PASS BAUD | 100% |
| FAIL BAUD | 50% |

Temperature (Thresholds or Current vs. Average) $WF_{TEMP}$

| THRESHOLD | WEIGHT |
| --- | --- |
| Low | 400% |
| Med-Low | 200% |
| Med | 100% |
| Med-High | 200% |
| High | 400% |

| CURRENT TEMP/CHANGE | WEIGHT | |
| --- | --- | --- |
| | 0 OR 1 ZONE | >1 ZONE |
| LOW | 200% | 400% |
| LOW-MED | 100% | 200% |
| MED | 100% | 200% |
| MED-HIGH | 100% | 200% |
| HIGH | 200% | 400% |

Time Since Last Successful Sync Word Correlation $WF_{TIME}$

| TIME (min) | WEIGHT |
| --- | --- |
| <1 | 100% |
| 1–10 | 200% |
| 10–60 | 400% |
| 60 | 800% |

The selection of weighting factors $WF_{DEV}$, $WF_{RSSI}$, and $WF_{BAUD/SYNC}$ are derived from the RF signal itself. However, the weighting factor $WF_{TIME}$ is derived indirectly from the RF signal and $WF_{TEMP}$ is totally independent of the RF signal. These latter two factors are unusual in that most of the other weighting factors reduce the composite weighting factor WF when they are outside of normal ranges whereas these factors do the opposite.

In any event, the values assigned to the weighting factors are dependent upon how far or to what degree the measurement for the corresponding parameter deviates from a normal or expected value or level. The further from an expected or normal range, generally, the lower weight that is given to that weighting factor for that parameter.

Time Since Last Sync Word Correlation ($WF_{TIME}$)

Successful sync word correlation in a paging channel indicates that the receiver is basically operating well, but failure to correlate may be an indication that the receiver is not receiving properly. The more time that elapses since the last successful sync word correlation, the more likely that the frequency may have drifted. In this case, the weighting factor is doubled, quadrupled, etc., in order to allow the AFC loop to respond faster when a long period of time has elapsed without a frequency adjustment.

Ambient Temperature and Temperature Change ($WF_{TEMP}$)

Figure 7:
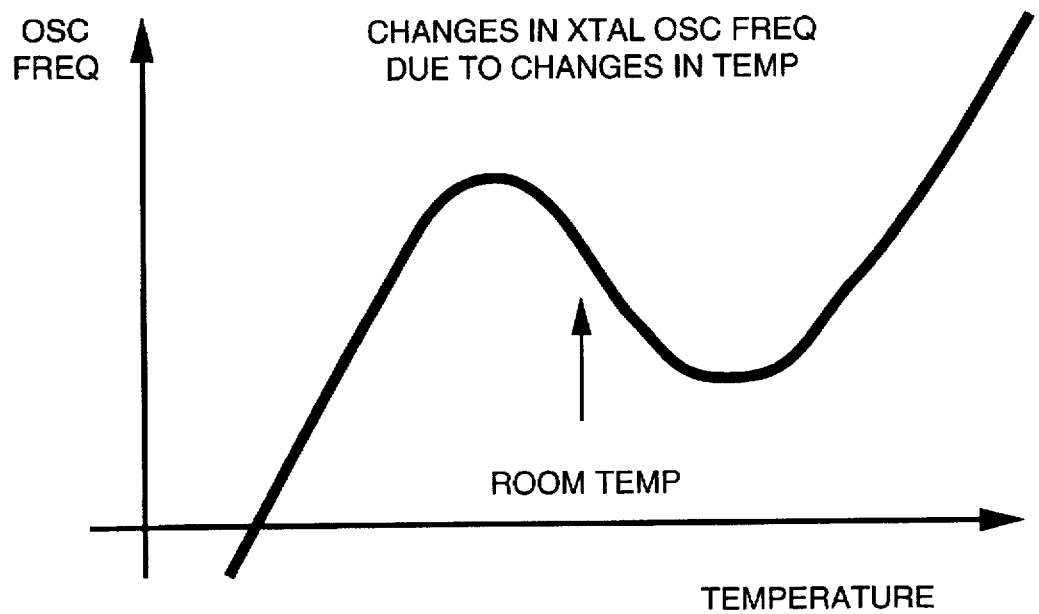
FIG. 7 is a frequency versus temperature graph illustrating change of oscillator frequency with temperature.

FIG. 7 depicts an oscillator frequency vs. temperature relationship for a exemplary oscillator. The curve indicates that there are larger frequency changes at extremely high and extremely low temperatures whereas the curve is "relatively" flat at middle range temperatures, including room temperature. For this reason, larger weighting factors are used to adjust for temperatures in the regions where the frequency change is the fastest. The ambient temperature is useful by itself or in conjunction with a running average temperature for optimum response, which is optionally saved from the last successful sync word correlation. If the current temperature is significantly different from the average temperature, then it is likely to coincide with a frequency drift. Generally, the larger the temperature change, the larger the frequency drift.

Returning now to FIG. 6, steps 400, 410 and 430 are similar to the corresponding steps shown in previous drawings. However, the step of determining the frequency error FE is optionally performed after step 480. Step 420 represents signal processing unrelated to the AFC process, such as, for example, baud detection, sync word correlation, address correlation, etc. In step 440, the PEAK and VALLEY values are read, along with the temperature and RSSI information of the receiver. Next, in step 450, the frequency error FE and frequency deviation DEV are calculated.

Next, in step 460, the values of the various weighting factors are determined based on whether each particular parameter is within its "normal" range, as shown in the tables above. Also as indicated in the tables above, a factor is set to zero in the event that it is determined that the measurement is so far out of range that it is not trustworthy. In step 70, a composite weighting factor WF is calculated on the basis of the product of all of the individual weighting factors, and then the inverse of the composite weighting factor WF is determined wherein A=1/WF. Step 480 restarts the process if the composite weighting factor WF is determined to be zero, which occurs if any one factor is set to zero in step 460, making the measurement for that cycle to be discarded or discounted.

Finally, in step 490, the updated average frequency error FEavg is computed based on the prior average frequency error FEavg. A new varactor tuning value is determined in step 500 on the basis of the updated FEavg and the varactor for the next receiver warm-up period is adjusted accordingly. The FEavg is reset if any adjustment is made.

Figure 9:
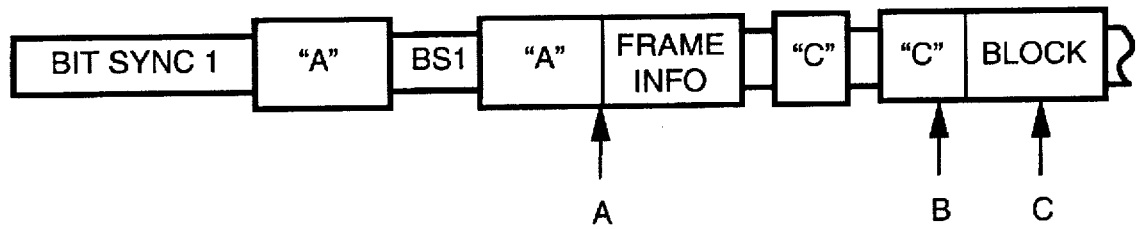
FIG. 9 is a timing diagram of another paging protocol signal.

The various AFC processes are useful in many types of receivers. FIGS. 8 and 9 are timing diagrams of paging protocols and illustrate examples of utilizing the process of FIG. 6 in a paging protocol. However, it should be understood that FIGS. 8 and 9 are only examples of the usefulness of the present invention and the present invention is useful with other protocols.

FIG. 8 is a diagram of a POCSAG (Post Office Code Standardization Advisory Group) paging protocol sequence. When the pager is not synchronous the receiver will be turned on sometime during the 576-bit preamble (when baud detect is performed) and AFC measurements are taken while the receiver is on. When the pager successfully correlates the 32-bit sync word then the pager becomes synchronous and the receiver is shut down to battery-save until the pager's address frame. At the appropriate time the receiver is turned-on to decode the 1st & 2nd half-frame information (example shown in FIG. 8 is for pager assigned to Frame 3) and AFC data is collected while the receiver is on. Following the frame, the receiver is again turned off to battery save until the next sync word and the process repeats until the batch ends. In this way the pager can perform frequency corrections in both the synchronous and asynchronous modes.

FIG. 9 is a diagram of another paging protocol developed by Motorola, Inc., and known under the trademark Flex™. When the pager is synchronous the decoder turns on the receiver some time prior to the "A" word and searches for an "A"-word match. The AFC measurement is postponed until it is determined that a signal is present because enabling the AFC measurement too soon may give erroneous data. Following successful "A"-word correlation the AFC processes are enabled and data is collected during the Frame Info and "C"/"C-Bar" intervals. Since the Frame Info is always sent as 2-level FM then it is ensured that full deviation signals are determined. However, it is also possible to collect data during the 4-level FM interval if it is guaranteed that at least one symbol of full deviation in both directions (PEAK & VALLEY) is received. The peak and valley measuring circuit optionally is frozen and read at some later time if the decoder is too busy to process the information immediately. In this case the peak and valley measuring circuit is frozen prior to signal loss for best results.

During the asynchronous mode, the AFC processes are performed in a similar manner as for a POCSAG signal.

Figure 10:
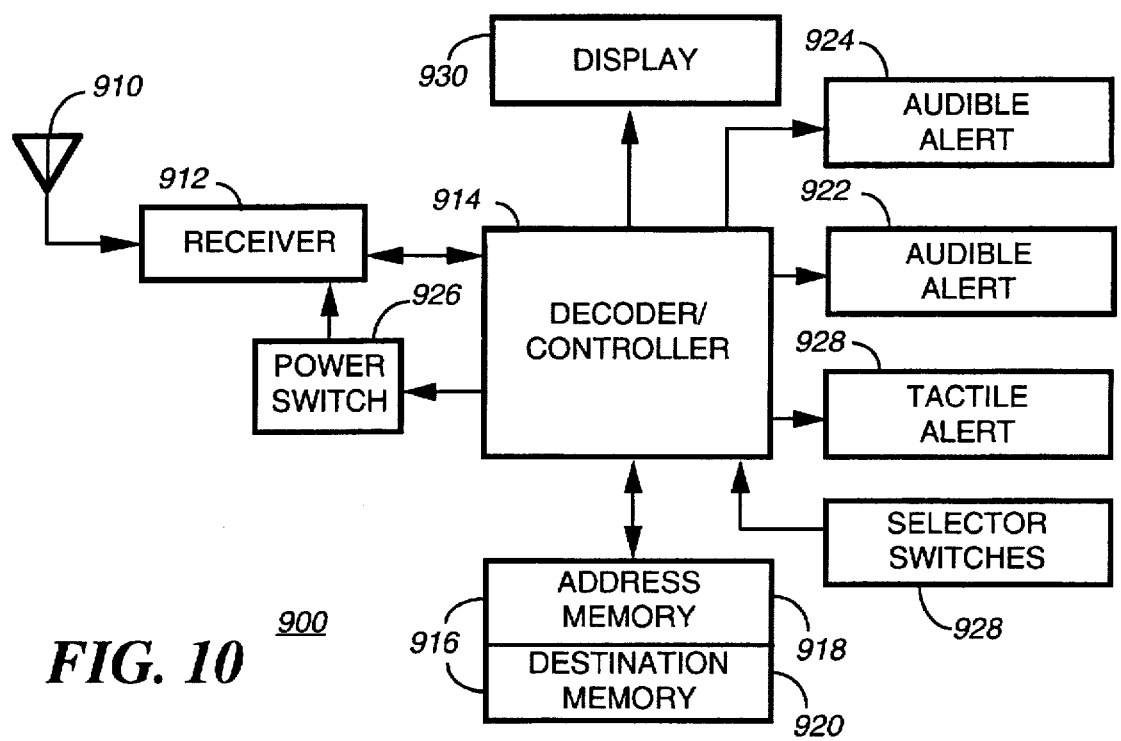
FIG. 10 is an electrical block diagram of a selective call receiver in accordance with the present invention.

A receiver circuit using the AFC processes described above is useful in many applications. FIG. 10 is an example of an application comprising a selective call receiver.

The selective call receiver 900 comprises an antenna 910, a receiver circuit 912, a decoder/controller 914, and a code plug memory 916 including an address memory 918 and a destination memory 920. The code plug memory 916 is programmable by a remote programming device, as is well known in the art. In addition, various alert devices are provided, such as the tactile alert 922 and the audible alert 924. A power switch 926 is also provided to activate and de-activate certain components of the selective call receiver 900 under control of the decoder/controller 914. The receiver 912 comprises the ZIF receiver circuit 10 or other receiver circuit implementing the AFC processes of the present invention.

User input into the selective call receiver is by way of selector switches 928. A menu of various user programmable features is accessed via the switches, through the use of menu information displayed on the display 930. The selector switches 928 allow adjustment of user programmable features.

Figure 11:
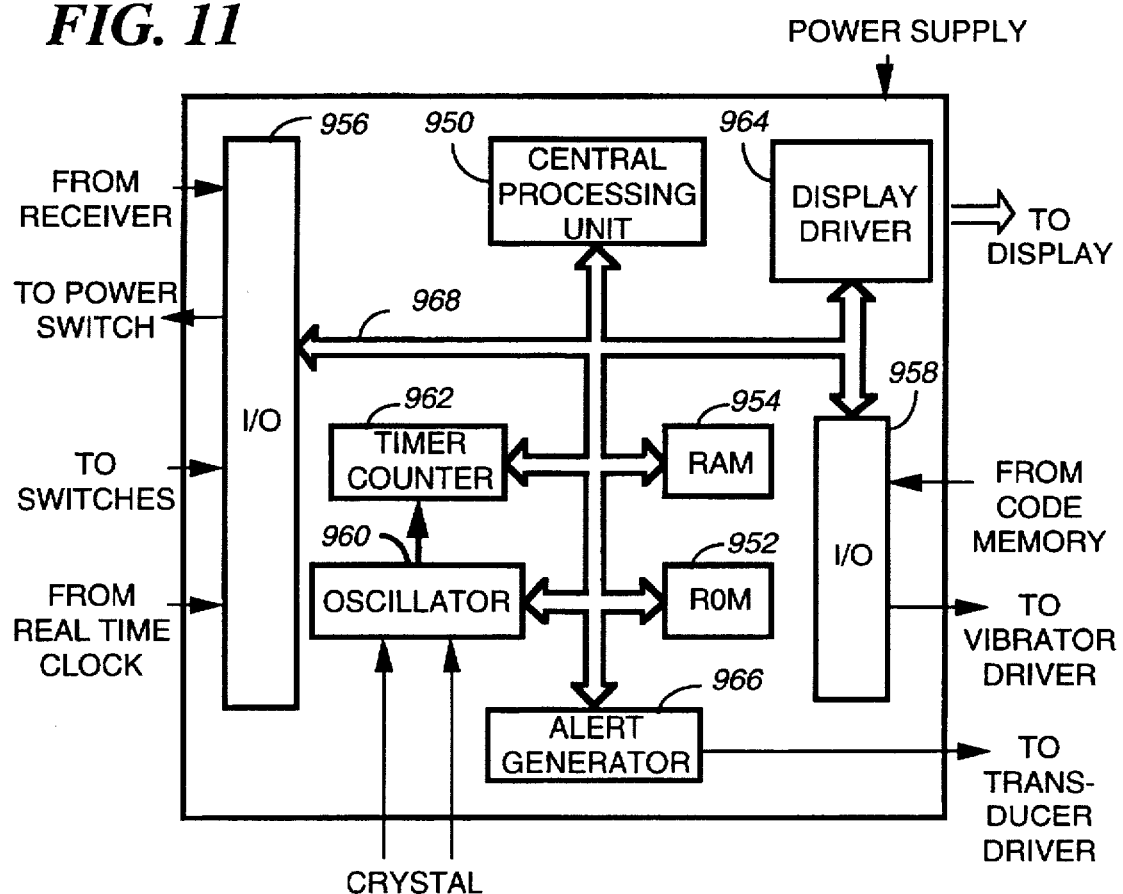
FIG. 11 is an electrical block diagram of a decoder/microcontroller of the selective call receiver in accordance with the present invention.

FIG. 11 illustrates the decoder/controller 914 in greater detail. A detailed explanation of these components is not needed for purposes of understanding the present invention. Briefly, at its heart, the decoder/controller 914 comprises a central processing unit 950 which processes software instructions stored in a ROM 952 and/or RAM 954. Data flow into and out of the decoder/controller 914 is controlled by input/output (I/O) ports 956 and 958. A timer counter 962 is connected to the oscillator 960 for certain timing functions. The central processing unit drives the display 930 via a display driver 964. An alert generator 966 generates triggering signals for the alert devices, such as the audible alert 924 and tactile alert 922 shown in FIG. 12. The various components of the central processing unit 950 communicate over the bus 968.

The software for executing the various AFC decision processes shown in FIGS. 3–6 is stored in the ROM 952 or RAM 954 and executed by the central processing unit 950. Thus, the decoder/controller 914 performs the AFC functions otherwise performed in a separate circuit, such as control module 50, and the selective call receiver signal decoding functions normally performed by a decoder/controller.

Furthermore, the functions of the decoder/controller 914 and the control module can be integrated into a single microprocessor or into a single digital signal processor.

In summary, the present invention is directed to an automatic frequency control (AFC) receiver circuit and a method for automatic frequency control in a receiver circuit involving the determination of at least one parameter other than a frequency error of the RF signal as received by the receiver circuit; and adjustment of a frequency of a signal which is mixed with the RF signal received by the receiver circuit based on a frequency error of the RF signal if the at least one parameter satisfies a predetermined criterion.

Information about the received signal and the receiver circuit itself is monitored, in addition to frequency error of the received signal, and the frequency error information is ignored, discarded, or weighted appropriately, based on other information that is measured. As a result, more accurate frequency error correction is made.

The above description is intended by way of example only and is not intended to limit the present invention in any way except as set forth in the following claims.

What is claimed is:

1. A method for controlling frequency error correction of a receiver circuit suitable for receiving a modulated radio frequency (RF) signal, the method comprising steps of:

determining a frequency error of a signal which is mixed with the RF signal received by the receiver circuit;

determining at least one parameter other than the frequency error, the at least one parameter comprising a baud rate Of the RF signal received by the receiver circuit;

determining whether the baud rate of the RF signal received by the receiver circuit satisfies a predetermined criterion; and adjusting the frequency of the signal which is mixed with the RF signal by the receiver circuit based on the frequency error if the baud rate satisfies the predetermined criterion.

2. The method of claim 1, wherein the step of determining whether the baud rate satisfies a predetermined criterion comprises comparing the baud rate of the RF signal with a predetermined baud rate.

3. The method of claim 1, wherein the step of determining whether the baud rate of satisfies a predetermined criterion comprises comparing a quality of a match between the baud rate of the RF signal received by the receiver circuit and an expected baud rate.

4. The method of claim 1, and further comprising the steps of generating a recovered audio signal on the basis of the RF signal received by the receiver circuit, and determining values representative of relative peaks and valleys of the recovered audio signal.

5. The method of claim 4, and further comprising the step of determining a frequency deviation of the RF signal received by the receiver circuit.

6. The method of claim 5, wherein the step of determining the frequency deviation comprises computing one-half of a sum of the values representative of the relative peaks and valleys of the recovered audio signal.

7. The method of claim 4, and further comprising the step of determining the frequency error by computing one-half of a difference between values representative of the relative peaks and valleys of the recovered audio signal.

8. The method of claim 1, wherein the baud rate and the frequency error are each determined at successive cycles.

9. The method of claim 8, and further comprising the step of computing an average frequency error based on a frequency error of a prior cycle.

10. The method of claim 9, wherein the frequency error of a prior cycle is weighted by a weighting factor.

11. The method of claim 1, wherein the step of determining the at least one parameter comprises determining a plurality of parameters of the RF signal, the plurality of parameters including a frequency deviation of the RF signal received by the receiver circuit.

12. The method of claim 11, and further comprising the steps of assigning a weighting factor for each parameter based on a deviation degree of each parameter from a normal range.

13. The method of claim 12, and further comprising the step of generating a composite weighting factor on the basis of all of the weighting factors corresponding to the plurality of parameters.

14. The method of claim 13, wherein the frequency of the signal which is mixed with the RF signal is adjusted based on the frequency error if the composite weighting factor satisfies the predetermined criterion.

15. The method of claim 11, wherein the plurality of parameters comprise at least two of frequency deviation, received signal strength, successful baud rate match between a baud rate of the RF signal and a predetermined baud rate, successful synchronization to data in the RF signal, and temperature of the receiver circuit.

16. The method of claim 1, wherein the step of adjusting a frequency of a signal comprises adjusting a frequency of a signal coupled to a frequency synthesizer.

17. The method of claim 1, wherein the step of adjusting comprises adjusting the frequency of the signal mixed with the received RF signal by a predetermined amount based on a direction of the frequency error.

18. A receiver circuit for receiving a radio frequency (RF) signal detected by an antenna, the receiver circuit comprising:

a mixer for mixing the RF signal with a mixing signal having an adjustable frequency; and a control circuit coupled to the mixer for determining a frequency error of the mixing signal which is mixed with the RF signal, determining at least one parameter other than the frequency error, the at least one parameter comprising a frequency deviation of the RF signal received by the receiver circuit, determining whether the frequency deviation satisfies a predetermined criterion, and changing the adjustable frequency of the mixing signal based on the frequency error if the frequency deviation satisfies the predetermined criterion.

19. A selective call receiver comprising the receiver circuit of claim 18.

20. The receiver circuit of claim 18, wherein the control circuit further determines a baud rate of the RF signal received by the receiver circuit, and whether the baud rate of the RF signal is substantially equal to a predetermined baud rate.

21. The receiver circuit of claim 18, wherein the control circuit determines whether the frequency deviation satisfies the predetermined criterion by determining whether the frequency deviation is within a predetermined range.

22. The receiver circuit of claim 18, and further comprising a demodulator coupled to the mixer for generating a recovered audio signal based on the RF signal received by the receiver circuit, and wherein the control circuit determines values representative of relative peaks and values of the recovered audio signal.

23. The receiver circuit of claim 22, wherein the control circuit determines a measurement of a frequency deviation of the RF signal received by the receiver circuit.

24. The receiver circuit of claim 23, wherein the control circuit determines the frequency deviation by computing one-half of a sum of the values representative of the relative peaks and valleys of the recovered audio signal.

25. The receiver circuit of claim 22, wherein the control circuit determines the frequency error by computing one-half of a difference between values representing the peaks and valleys of the recovered audio signal.

26. The receiver circuit of claim 18, wherein the control circuit determines the at least one parameter and the frequency error each at successive cycles.

27. The receiver circuit of claim 26, wherein the control circuit computes an average frequency error based on a frequency error of a prior cycle.

28. The receiver circuit of claim 27, wherein the control circuit weights the frequency error of a prior cycle by a predetermined weighting factor.

29. The receiver circuit of claim 18, wherein the control circuit determines a plurality of parameters of the RF signal, the plurality of parameters including a baud rate of the RF signal received by the receiver circuit.

30. The receiver circuit of claim 29, wherein the control circuit assigns a weighting factor for each parameter based on a deviation degree of each parameter from a normal range.

31. The receiver circuit of claim 30, wherein the control circuit generates a composite weighting factor on the basis of all of the weighting factors corresponding to the plurality of parameters.

32. The receiver circuit of claim 31, wherein the control circuit changes the frequency of the signal which is mixed with the RF signal based on the frequency error if the composite weighting factor satisfies the predetermined criterion.

33. The receiver circuit of claim 18, and further comprising a frequency synthesizer coupled to the mixer for generating the mixing signal.

* * * * *